United States Patent
Huard (10) Patent No.: US 9,712,182 B1
(45) Date of Patent: Jul. 18, 2017

(54) DIGITAL TO ANALOG CONVERSION CIRCUIT AND METHOD

(71) Applicant: Rohde & Schwarz GmbH & Co. KG, München (DE)

(72) Inventor: Rich Huard, Beaverton, OR (US)

(73) Assignee: ROHDE & SCHWARZ GMBH & CO. KG, München (DE)

( * ) Notice: Subject to any disclaimer, the term of this patent is extended or adjusted under 35 U.S.C. 154(b) by 0 days.

(21) Appl. No.: 15/293,598

(22) Filed: Oct. 14, 2016

(51) Int. Cl.
 *H03M 1/66* (2006.01)
 *H03M 1/74* (2006.01)
 *H03M 1/78* (2006.01)

(52) U.S. Cl.
 CPC .......... *H03M 1/66* (2013.01); *H03M 1/742* (2013.01); *H03M 1/785* (2013.01)

(58) Field of Classification Search
 None
 See application file for complete search history.

(56) References Cited

U.S. PATENT DOCUMENTS

| | | | | |
|---|---|---|---|---|
| 4,663,610 A * | 5/1987 | Metz | ..................... | H03M 1/745 341/133 |
| 6,246,279 B1 * | 6/2001 | Komuro | .................. | H03M 1/70 327/306 |
| 8,907,830 B2 * | 12/2014 | Bruennert | ............. | H03M 1/685 341/145 |

* cited by examiner

*Primary Examiner* — Howard Williams
(74) *Attorney, Agent, or Firm* — Jenkins, Wilson, Taylor & Hunt, P.A.

(57) ABSTRACT

A digital to analog conversion circuit, DAC, comprises a number of serializing lanes, each serializing lane comprising at least two bit inputs, and each serializing lane being configured to output the two bit inputs serially via a serialized output port at a predetermined first clock rate. The DAC further comprises a number of non-serializing lanes, each non-serializing lane comprising at least two bit inputs and each non-serializing lane being configured to output the two bit inputs in parallel each via a separate parallel output port, at a second clock rate, which is half the clock rate of the first clock rate, and a current switching network comprising a bit input port for every one of the serialized output ports and for every one of the parallel output ports and being configured to produce a output current, based on the signals received via the bit input ports.

24 Claims, 6 Drawing Sheets

DIGITAL TO ANALOG CONVERSION CIRCUIT AND METHOD

TECHNICAL FIELD

The invention relates to a digital to analog conversion circuit and a corresponding method.

BACKGROUND

Although applicable to any system that that uses digital to analog conversion, the present invention will mainly be described in combination with multi-architecture or segmented digital-to-analog converters or DACs.

Today DACs are used in a wide variety of electronic devices. DACs are used everywhere, where digital values have to be converted into currents or voltages. A possible application for DACs are e.g. wireless devices, where a communication controller provides digital data signals, which have to be converted into analog signals to drive an antenna of the wireless device.

A plurality of different DAC architectures exist today. Therefore, for a given application the most adequate architecture can be selected. However, sometimes a single architecture is not the most adequate or does not yield the desired results.

In such cases, two or more DACs of different configurations or architectures can be combined into a segmented DAC or multi-architecture DAC.

When designing a DAC for a specific application, usually the bit depth of the DAC and the conversion rate are predetermined and the respective DAC is specifically designed to comply with these predetermined parameters. Such DACs offer only little flexibility.

Accordingly, there is a need for more flexible DACs.

SUMMARY

A digital to analog conversion circuit, DAC, comprises a number, i.e. one or more, of serializing lanes, each serializing lane comprising at least two bit inputs, i.e. inputs which each receive one bit, and each serializing lane being configured to output the two bit inputs serially via a serialized output port at a predetermined first clock rate, i.e. one after the other. The DAC further comprises a number, i.e. one or more, of non-serializing lanes, each non-serializing lane comprising at least two bit inputs and each non-serializing lane being configured to output the two bit inputs in parallel each via a separate parallel output port, i.e. both at the same time via different output ports, at a second clock rate, which is half the clock rate of the first clock rate, and a current switching network comprising a bit input port for every one of the serialized output ports and for every one of the parallel output ports and being configured to produce an output current or voltage, i.e. positive or negative, based on the signals received via the bit input ports.

A method for digital-to-analog conversion comprises outputting two bit inputs serially via a serialized output port at a predetermined first clock rate with each one of a number of serializing lanes, each serializing lane comprising at least two bit inputs, and outputting two bit inputs in parallel, each via a separate parallel output port of each one of a number of non-serializing lanes at a second clock rate, which is half the clock rate of the first clock rate, each non-serializing lane comprising at least two bit inputs, and finally producing an output current or voltage based on the serially output bits and the bits output in parallel with a current switching network, which comprises a bit input port for every one of the serialized output ports and for every one of the parallel output ports.

The present invention allows to modify a DAC with a plurality of serializing lanes, which run at a first clock rate or frequency, to include further non-serializing lanes, which can process two further bits with half the clock rate or frequency of the serializing lanes.

This allows reusing existing serializing lanes in DAC designs and at the same time flexibly adapting the function of the DAC, i.e. incrementing the bit depth of the DAC.

Further embodiments of the present invention are subject of the further subclaims and of the following description, referring to the drawings.

In a possible embodiment, the digital to analog conversion circuit can comprise a clock buffer, i.e. a low phase noise clock buffer, and a clock tree with a predetermined load, wherein the clock buffer is tuned to drive the clock tree with the predetermined load. The clock can be generated by any clock generator, like e.g. an oscillator circuit, a PLL or the like. The clock tree distributes the clock or clock signal evenly in the DAC. It is important that the signal delays in the single clock lines are equal such that the clock signal is received by the respective receivers at the same time and without offsets or jitter. The clock tree can e.g. comprise a split layout, where branches always extend symmetrically from the higher-ranking branch. This provides a symmetric signal distribution with equal length signal paths and therefore the same signal propagation delay.

It is important for the clock buffer to be tuned to the load of the clock tree. This means that the combination of clock buffer and clock tree is a fine-tuned construction, which is difficult to change. Any change in this system requires huge efforts for the fine-tuning.

In a possible embodiment, the current switching network can comprise for each one of the serializing lanes a switching device, e.g. an analog switch, connected to the respective serialized output port and for each one of the non-serializing lanes two switching devices, each switching device being connected to the respective parallel output port, each one of the switches being further connected to a respective output port of the clock tree. The switching devices will therefore change their switching state depending on the value of the respective output port of the serializing or non-serializing lane with the rate of the clock signal being provided by the output port of the clock tree. It is understood, that the switching devices can be low-active or high-active.

In a possible embodiment, in each case the two switching devices being connected to the two parallel output ports of one of the non-serializing lanes, in sum can provide the same load on the respective output ports of the clock tree as one switching device of one of the output ports, which is connected to one of the serializing lanes. This arrangement allows exchanging one of the serializing lanes, which each provide one bit of the total bit depth of the DAC, with a non-serializing lane, which increases the bit depth by one.

At the same time the load on the clock tree is kept constant. In order to keep the load on the clock tree constant, the design of the switching devices for the non-serializing lanes can be adapted accordingly. The switching devices for the non-serializing lanes should each switch half the current of the switching devices for the serializing lanes. Since the switching devices for the non-serializing lanes switch only a reduced current the size e.g. of the respective switching transistors can also be reduced by the same amount. Therefore, if half the current is switched the switching transistors can be provided with half the size. Both factors, transistor size, and the magnitude of the current switched, result in a clock load of two switching devices for the non-serializing lanes that is nearly identical to the clock load of a single switching device for the serializing lanes. The switching devices for the non-serializing lanes can be connected in parallel and then provide almost the same load on the clock tree as a single switching device for the serializing lanes.

As describe above, clock trees can be fine-tuned to drive a predetermined load. The invention provides two switching devices in one non-serializing lane with the same summed load on the clock tree as single switching devices in serializing lane. This allows driving with an unmodified clock tree two switches instead of one switch. The invention therefore allows using the existing clock tree and increasing the number of bits that can be converted with the DAC using the clock tree.

In a possible embodiment, the current switching network can comprise a R-2R circuit, or R-2R ladder, connected to the switching devices such that the current produced by the R-R2 circuit is generated based on the switching states of the switching devices. An R-2R ladder is simple and effective circuit for converting parallel bit values into an analogue current or voltage.

In a possible embodiment, the digital to analog conversion circuit can comprise a bit switching circuit for providing the same bit value on both inputs of the single serializing lanes. The serializing lanes run at double the clock rate of the non-serializing lanes and output two bit values consecutively in one clock cycle of the non-serializing lanes. Therefore, when used in conjunction with non-serializing lanes, the two bit inputs of the serializing lanes have to be provided with the same bit value. The serializing lanes will then output the same value for two of their clock cycles, i.e. one clock cycle of the non-serializing lanes.

In a possible embodiment, the digital to analog conversion circuit can comprise a lane switching circuit, which activates either a non-serializing lane in an increased bit-depth mode or activates a serializing lane in an increased conversion rate mode, where only serializing lanes are used. This allows easily switching between the use of a serializing lane or a non-serializing lane depending on the intended use of the DAC. In the increased bit-depth mode each non-serializing lane can substitute one of the serializing lanes and provide an additional bit to the total bit depth of the DAC. Therefore the DAC can be switched between the increased bit-depth mode and the increased conversion rate mode easily.

For example a DAC can have a bit-depth of 13 bit in the increased conversion rate mode, where thirteen serializing lanes are used to convert the digital value to an analog value. The same DAC can be switched into the increased bit-depth mode by switching the LSB lane (Least Significant Bit) from a serializing to a non-serializing lane. The non-serializing lane can then be provided with two instead of one input bit value and the bit-depth of the DAC raises to 14 bit. It is understood, that more than one serializing lane can be substituted by the switching device with a non-serializing lane for a given number of LSB bits.

In a possible embodiment, the digital to analog conversion circuit can comprise a bit switching circuit for providing the same bit value on both of the inputs of the single serializing lanes in the increased bit-depth mode and for providing two consecutive bit values on both of the inputs of the single serializing lanes in the increased conversion rate mode. The serializing lanes will always serialize the two input bits. The bit switching circuit will therefore provide the same bit values, i.e. the value of a single source bit, at the two inputs of the serializing lanes in the increased bit-depth mode. In contrast, in the increased conversion rate mode the bit switching circuit will provide the values of two consecutive source bits at the inputs of the serializing lanes and of two different source bits at the inputs of the non-serializing lanes.

In a possible embodiment, each one of the serializing lanes and each one of the non-serializing lanes can comprise for every bit input a first latch, which is connected to the respective input, and a second latch, which is connected to the first latch. The latches will delay the input signals exactly as needed to provide the correct output signals to the switching devices.

In a possible embodiment, the digital to analog conversion circuit can comprise a clock input, which provides a clock signal, and a clock inverter, which is connected to the clock input and provides an inverted clock signal, wherein the first latches are clocked by the inverted clock signal and the second latches are clocked by the clock signal. The clock signal provided by the clock input can e.g. have half the frequency as the original clock signal provided by the clock tree e.g. to the above mentioned switching devices.

In a possible embodiment, each serializing lane can comprise for the second bit input a third latch, which is connected to the second latch and is clocked by the inverted clock signal, and a multiplexer, which is connected to the second latch of the first bit input and the third latch and is clocked by the inverted clock signal. The third latches will delay the input signals exactly as needed to provide the correct output signals to the multiplexer, which will consecutively output the bit values to the switching devices.

In a possible embodiment, the digital to analog conversion circuit can comprise digital to analog conversion, DAC, segments, wherein the serializing lanes and the non-serializing lanes form a first DAC segment for a predetermined number of least significant bits of the DAC, and the further DAC segments convert the further bits of the total bit depth of the DAC.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

DETAILED DESCRIPTION OF THE DRAWINGS

Figure 1:
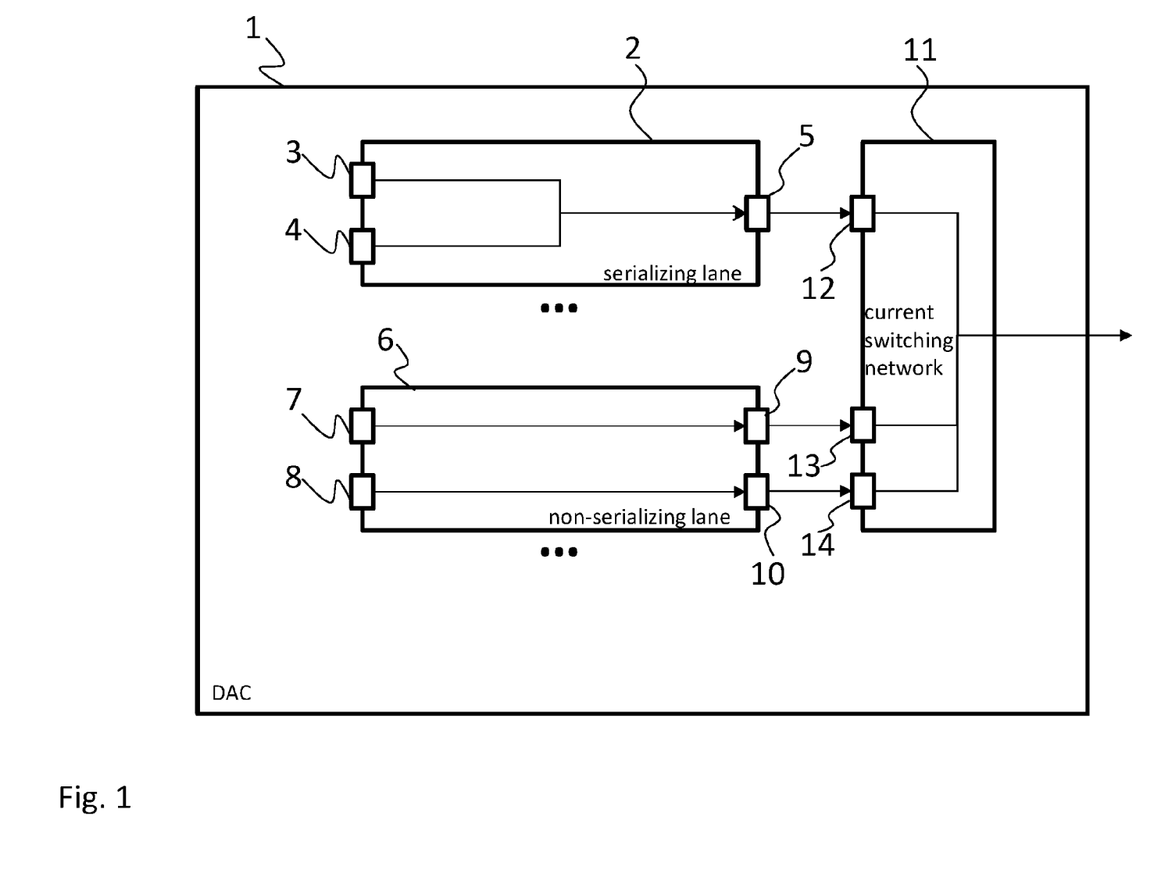
FIG. 1 shows a block diagram of an embodiment of a DAC according to an embodiment of the present invention.

The digital to analog conversion circuit, DAC, 1 of FIG. 1 comprises a plurality of serializing lanes 2. Only one serializing lane 2 is shown. However, further serializing lanes are hinted at by three dots. The DAC 1 further comprises at least one non-serializing lane 6. As with serializing lane 2 only one non-serializing lane 6 is shown. However, further non-serializing lanes are hinted at by three dots.

The structure of the serializing lanes will be describes regarding the serializing lane 2. It is understood that further serializing lanes can comprise the same structure. Serializing lane 2 comprises two bit inputs 3, 4. Via bit inputs 3, 4 the serializing lane receives to bit values from an upstream circuitry (not shown). The upstream circuitry can be any circuitry in the DAC 1 that serves to provide the necessary bit values based on a digital input to the DAC 1.

The serializing lane 2 comprises only one serialized output 5, via which the bit values of the bit inputs 3, 4 are forwarded serially. That means that the serializing lane 2 will first output the bit value of the first bit input 3 and then the bit value of the second bit input 4. The timing of the signal output will be based on a first clock rate.

The structure of the non-serializing lanes will be describes regarding the non-serializing lane 6. It is understood that further non-serializing lanes can comprise the same structure. The non-serializing lane 6 comprises two bit inputs 7, 8. Further the non-serializing lane 6 comprises two parallel bit outputs 9, 10.

In contrast to the serializing lane 2, the non-serializing lane 6 will directly output the bit values of the bit inputs 7, 8 to the respective parallel bit output 9, 10. However, the non-serializing lane 6 will output the values at a second clock rate, which is half the clock rate of the first clock rate.

Figure 2:
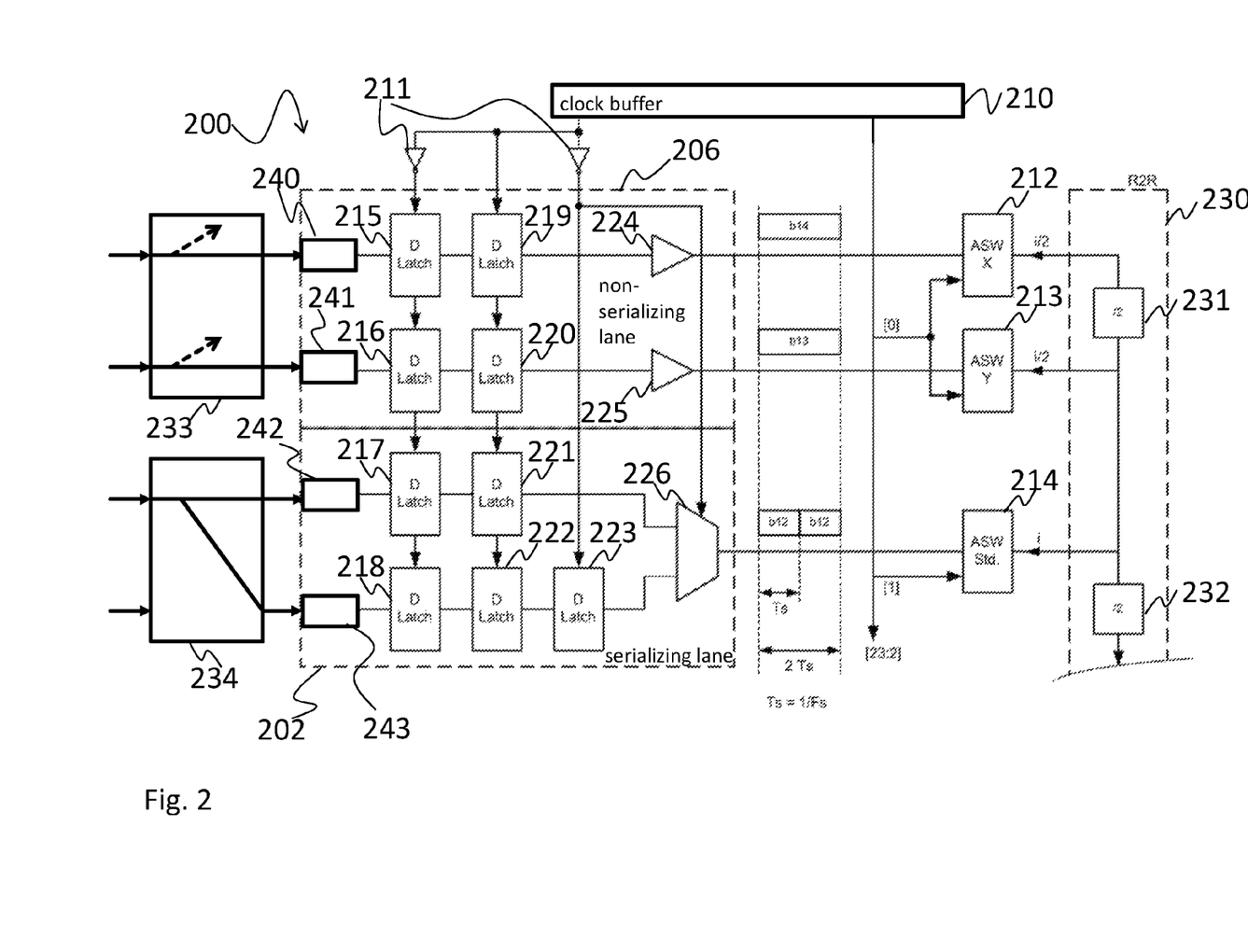
FIG. 2 shows a block diagram of another embodiment of a DAC according to an embodiment of the present invention.

FIG. 2 shows a more detailed view of a DAC 200 according to the present invention. Again, only one serializing lane 202 and one none-serializing lane 206 are shown representative for any number of serializing and non-serializing lanes.

The serializing lane 202 comprises two bit inputs 242, 243, which are each connected to a respective first latch 217, 218. The first latches 217, 218 are each connected to a respective second latch 221, 222. Finally, the second latch 222 of the second bit input 243 is connected to a third latch 223. The second latch 221 and the third latch 223 are both connected to a multiplexer 226, which will output the respective bit values alternatingly.

The non-serializing lane 206 also comprises two bit inputs 240, 241, which are each connected to a respective first latch 215, 216. The first latches 215, 216 are both connected to respective second latches 219, 220. The second latches 219, 220 are each connected to a respective driver 224, 225, which each output the respective bit value.

The outputs of the multiplexer 226 and the drivers 224, 225 are each provided to respective analog switches 212, 213, 214, which will drive a R-2R network or circuit 230 based on the outputs to produce a corresponding current.

The DAC 200 also comprises a clock buffer 210 and a clock tree (see FIG. 3), which are just schematically shown in FIG. 1 and drive the single elements, i.e. the latches 215-223, the multiplexer 226 and the switches 212, 213, 214. The serializing lane 202 and the non-serializing lane 206 are both driven with half the clock rate of the switches 212, 213, 214. The first latches 215-218 and the multiplexer 226 are further driven with an inverted clock signal.

Between the serializing lane 202 and the non-serializing lane 206 and the switches 212, 213, 214, the outputs of the serializing lane 202 and the non-serializing lane 206 are shown.

The serializing lane 202 will output for one clock cycle Ts, i.e. two clock cycles of the switches 212, 213, 214, the bit value received via the first bit input 242. The serializing lane 202 will then output for another clock cycle Ts the bit value received via the second bit input 243.

The non-serializing lane 206 will output for two clock cycles 2Ts, i.e. four clock cycles of the switches 212, 213, 214, the bit value received via the first bit input 240 and the bit value received via the second bit input 241.

In addition, the two switches 212, 213, which are connected to the outputs of the non-serializing lane 206 are designed to provide the same load on the clock tree together as the single switch 214 for the serializing lane 202. This is indicated by current i with switch 214 and currents i/2 with switches 212, 213.

The serializing lane 202 is preceded by an optional bit switching circuit 234, which provides on both bit inputs 242, 243 of the serializing lane 206 the respective bit values for two clock cycles, 2 Ts. That means that the bit switching circuit 234 may e.g. receive two bit values via two ports and provide the first input value of the first port to both bit inputs 242, 243 for two clock cycles and then the second input value of the second port to both bit inputs 242, 243 for two clock cycles.

Further, the non-serializing lane 206 is preceded by an optional lane switching circuit 233. The lane switching circuit 233 serves to direct the two bit values for the bit inputs either to the bit inputs 240, 241 of the non-serializing lane 206 or another—not shown—serializing lane. The lane switching circuit 233 can e.g. be used, if the mode of operation of the DAC 200 must be switched in the application e.g. from a 12 or 13 bit high speed DAC to a 14 bit DAC with half the speed.

In the structure of FIG. 2 it becomes clear that the clock tree and therefore also the clock buffer are charged with the same load by the non-serializing lane 206, as by the serializing lane 202. It is therefore possible to use the shown arrangement with existing fine-tuned clock buffers and clock trees without the need to change the clock buffer and clock tree. Therefore, the bit depth of a DAC can be incremented with only slight changes to the lanes, e.g. by substituting a serializing lane with a non-serializing lane or by providing a lane switching circuit 233 and a non-serializing in parallel to an existing serializing lane.

Figure 3:
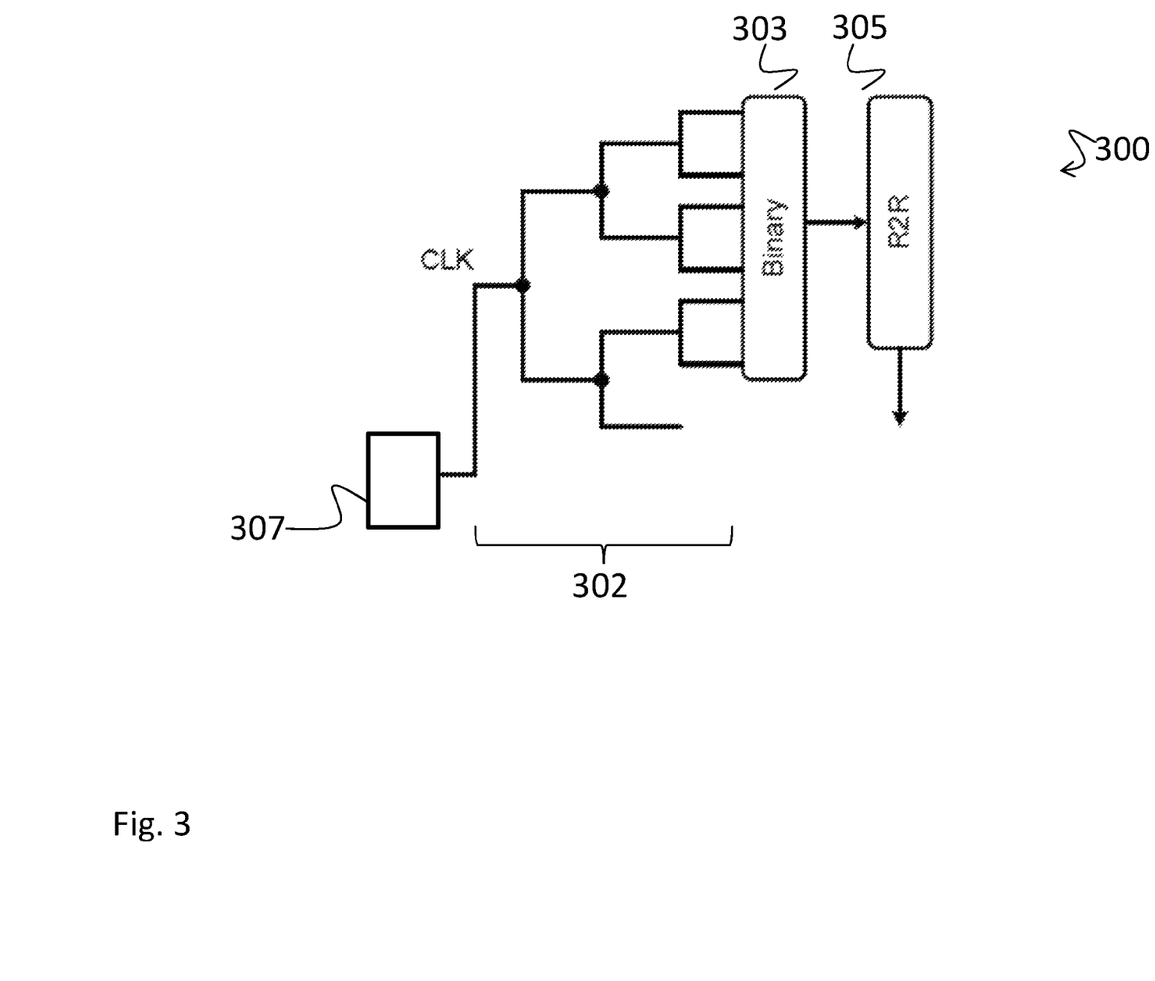
FIG. 3 shows a block diagram of another embodiment of a DAC according to an embodiment of the present invention.

FIG. 3 shows an overview of a DAC 300. The DAC 300 comprises a clock buffer 307, which provides a clock signal to a clock tree 302. Further, the DAC 300 comprises a binary segment 303. Further, a R-2R ladder 305 is provided for the binary segment 303 to convert the respective switching states into a current, which can then be combined e.g. by a mixer with the output of other DAC segments. FIG. 3 focuses on the clock system of the DAC 300. The data routing part of the DAC 300 is omitted for sake of simplicity.

The clock buffer 307 is exactly tuned to drive the clock tree 302 and the loads of the respective switches. Therefore, it is not possible to reuse the clock buffer 307 and the clock tree 302, if the load in the segment 303 changes. Therefore, if the bit depth of the DAC 300 is to be increased, the above described serializing lanes of FIGS. 1 and 2 can provide an additional bit for every serializing lane that is substituted in the binary segment 303 without changing the load on the clock tree 302.

That means that if one serializing lane is substituted with one non-serializing lane the bit depth of the DAC 300 can be increased to 14 bit. This substitution can be performed for an arbitrary number of the serializing lanes in the binary segment. Therefore up to 9 extra bits can be provided with a total resulting bit depth of 22 bit.

Further, with the help of the above described lane switching circuit 233, the bit depth of the DAC can be changed controllably in the respective application.

Figure 4:
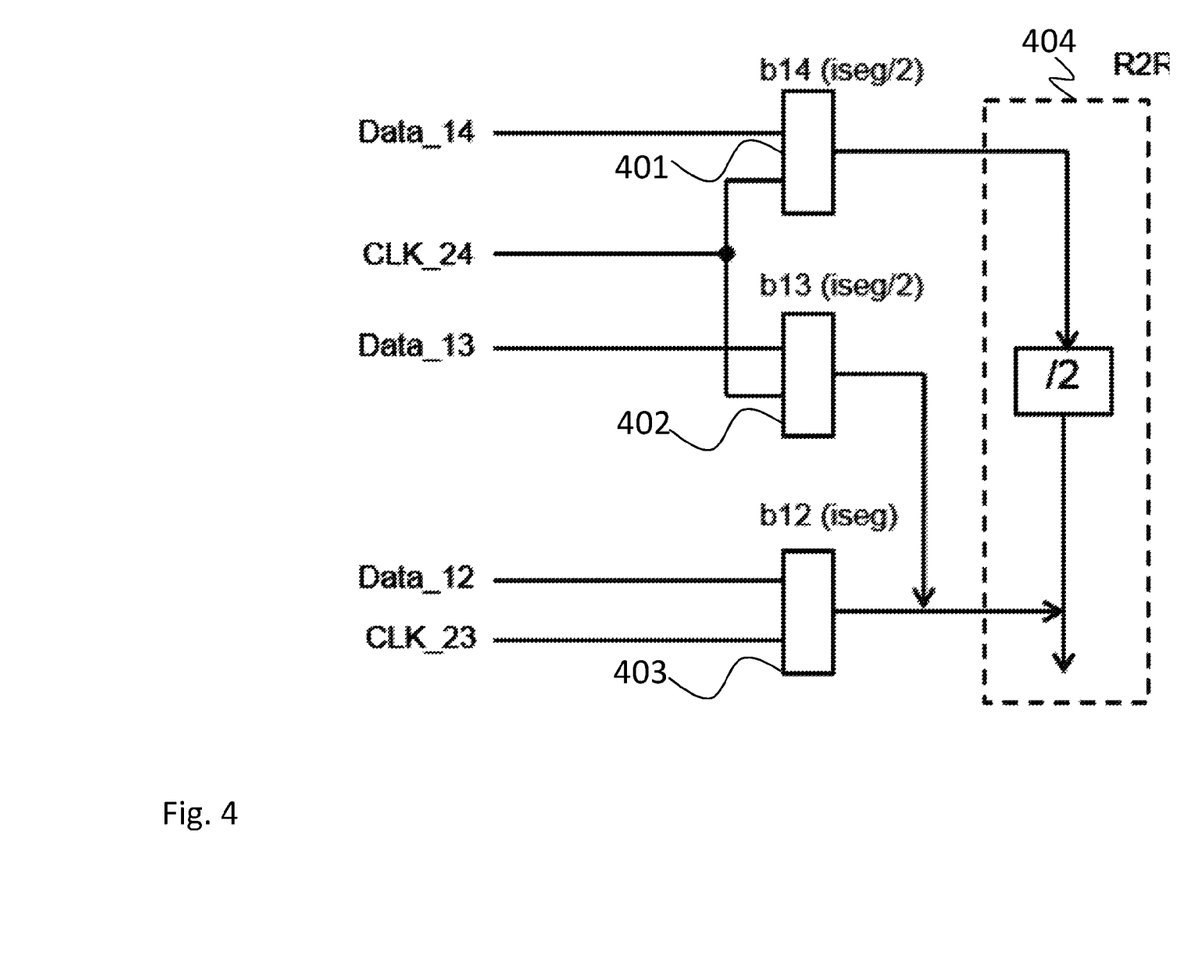
FIG. 4 shows a block diagram of an embodiment of a DAC according to an embodiment of the present invention.

FIG. 4 shows a larger scale section of a DAC according to the present invention with focus on the analog switches 401, 402, 402 and their connection to the R-2R ladder.

In FIG. 4 a single clock line CLK_24 drives the two analog switches 401, 402, which will be driven by outputs, Data_13 and Data_14, from a non-serializing lane. Both of these switches 401, 402 present the same load to the clock tree, which is half the load of switch 403.

Switch 403 is driven by an output Data_12 of a serializing lane and presents the same load to the clock line CLK_23 as both of the switches 401, 402 together.

If switch 402 presents half the load of switch 403, the output of switch 402 can be half the magnitude of the output of switch 403. Therefore in terms of binary scaling no further adaption of the output current of switch 402 is necessary and the current can directly be added to the output current of switch 403. However, for correct binary scaling the output of switch 401, which represents the least significant bit, must be scaled by the R-2R ladder, i.e. divided by 2.

Figure 5:
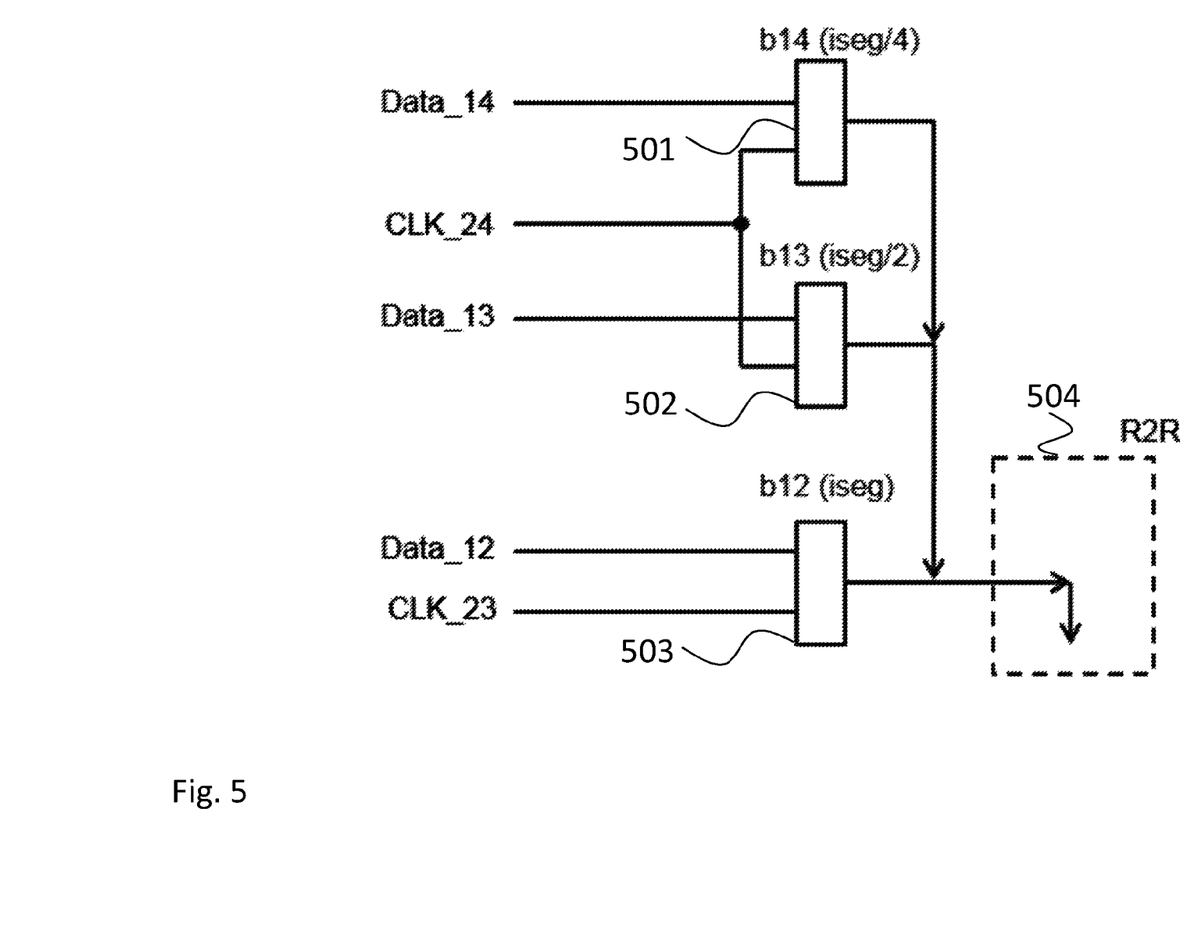
FIG. 5 shows a block diagram of an embodiment of a DAC according to an embodiment of the present invention.

FIG. 5 shows an alternate arrangement, where switch 501 provides a fourth of the current compared to switch 503. Therefore, no further scaling is necessary and the output currents of switches 501, 502, 503 can directly be combined to provide a respective output.

Figure 6:
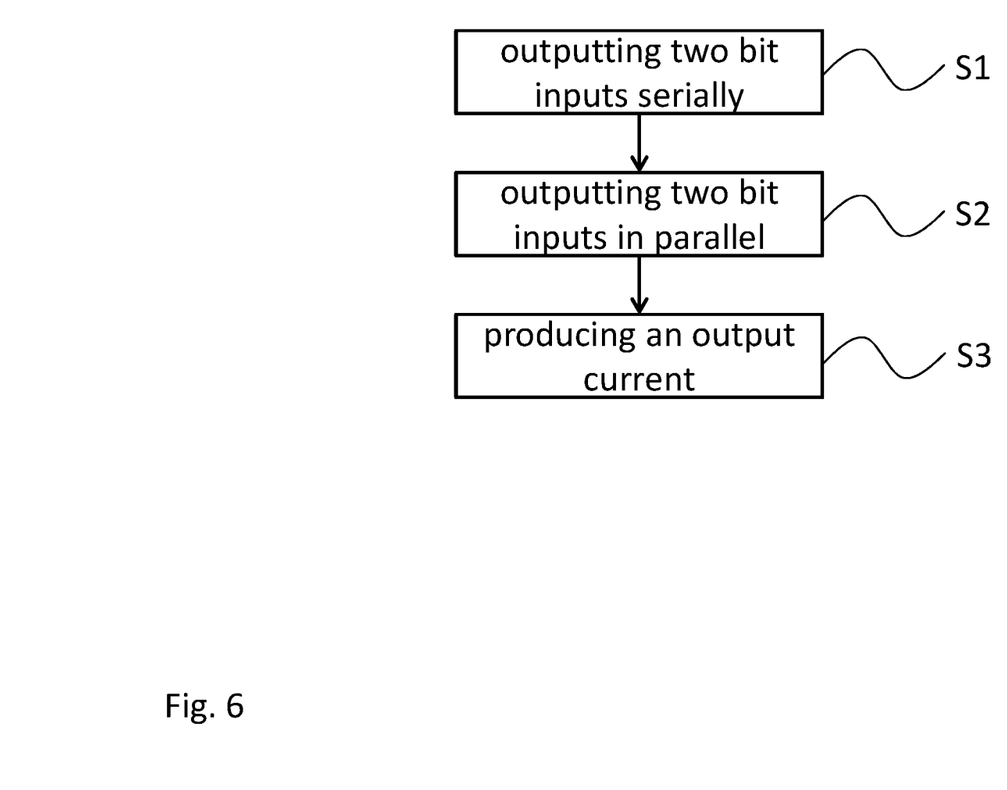
FIG. 6 shows a flow diagram of an embodiment of a method according to an embodiment of the present invention.

FIG. 6 shows a flow diagram of a method for digital-to-analog conversion, which can e.g. be used with the DAC architectures shown in FIGS. 1-5.

The method comprises outputting S1 two bit inputs serially via a serialized output port 5 at a predetermined first clock rate with each one of a number of serializing lanes 2, 202, each serializing lane 2, 202 comprising at least two bit inputs 3, 4, 242, 243.

The method further comprises outputting S2 two bit inputs, i.e. the respective bit values, in parallel each via a separate parallel output port 9, 10 of each one of a number of non-serializing lanes 6, 206 at a second clock rate, which is half the clock rate of the first clock rate, each non-serializing lane comprising at least two bit inputs 7, 8, 240, 241.

Finally, the method comprises producing S3 an output current or voltage based on the serially output bits and the bits output in parallel with a current switching network 11, which comprises a bit input port 12, 13, 14 for every one of the serialized output ports 5 and for every one of the parallel output ports 9, 10.

The output current can e.g. be produced in each one of the serializing lanes 2, 202 with a switching device 214, 403, 503 connected to the respective serialized output port 5. The output current in each one of the non-serializing lanes 6, 206 can e.g. be produced with two switching devices 212, 213, 401, 402, 501, 502, each switching device 212, 213, 401, 402, 501, 502 being connected to the respective parallel output port 9, 10, each one of the switching devices 212, 213, 401, 402, 501, 502 being further connected to a respective output port of a clock tree 302.

Further, the output current can e.g. be produced with an R-2R ladder or circuit 305, 404, 504 connected to the switching devices 214, 403, 503, 212, 213, 401, 402, 501, 502 based on the switching states of the switching devices 214, 403, 503, 212, 213, 401, 402, 501, 502.

Further, in each case with the two switching devices 212, 213, 401, 402, 501, 502 being connected to two of the bit output ports 9, 12, which are connected to one of the non-serializing lanes 6, 206, in sum the same load can be provided on the respective output ports of the clock tree 302 as with one switching device 214 being connected to one of the bit output ports 5 of one of the serializing lanes 2, 202.

The method can also comprise generating a clock signal with a clock buffer 210, 307 and distributing the clock signal with a clock tree 302 with a predetermined load, wherein the clock buffer 210, 307 is tuned to drive the clock tree 302 with the predetermined load.

The method can further comprise activating either a non-serializing lane 2, 202 in an increased bit-depth mode or activating a serializing lane 6, 206 in an increased conversion rate mode. In the increased bit-depth mode the same bit value can be provided on both of the inputs of the single serializing lane 2, 202. Further two consecutive bit values can be provided on both of the inputs of the single serializing lane 2, 202 in the increased conversion rate mode.

In each one of the serializing lanes 2, 202 and each one of the non-serializing lanes 6, 206 every bit input can be delayed via a first latch 215-218, which is connected to the respective input, and a second latch 219-222, which is connected to the first latch. In each serializing lane 2, 202 the second bit input can be further delayed with a third latch 223, which is connected to the second latch 222 and is clocked by an inverted clock signal. Further, the signals of the second latch 221 of the first bit input and the third latch 223 can be multiplexed.

Finally, a clock signal and an inverted clock signal can be provided, wherein the first latches 215-218 and the multiplexer 226 are clocked by the inverted clock signal and the second latches 219-222 are clocked by the clock signal.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A digital to analog conversion circuit, DAC, comprising:
  a number of serializing lanes, each serializing lane comprising at least two bit inputs, and each serializing lane being configured to output the two bit inputs serially via a serialized output port at a predetermined first clock rate,
  a number of non-serializing lanes, each non-serializing lane comprising at least two bit inputs and each non-serializing lane being configured to output the two bit inputs in parallel each via a separate parallel output port, at a second clock rate, which is half the clock rate of the first clock rate, and
  a current switching network comprising a bit input port for every one of the serialized output ports and for every one of the parallel output ports and being configured to produce a output current, based on the signals received via the bit input ports.

2. The digital to analog conversion circuit of claim 1, the digital to analog conversion circuit comprising a clock buffer and a clock tree with a predetermined load, wherein the clock buffer is tuned to drive the clock tree with the predetermined load.

3. The digital to analog conversion circuit of claim 2, the current switching network comprising for each one of the serializing lanes a switching device, connected to the respective serialized output port and for each one of the non-serializing lanes two switching devices, each switching device being connected to the respective parallel output port, each one of the switching devices being further connected to a respective output port of the clock tree.

4. The digital to analog conversion circuit of claim 3, wherein in each case the two switching devices being connected to the two bit output ports of one of the non-serializing lanes in sum provide the same load on the respective output ports of the clock tree as one switching device being connected to one of the bit output ports of one of the serializing lanes.

5. The digital to analog conversion circuit of claim 3, the current switching network comprising an R-2R circuit connected to the switching devices such that the current produced by the R-R2 circuit is generated based on the switching states of the switching devices.

6. The digital to analog conversion circuit of claim 1, the digital to analog conversion circuit comprising a bit switching circuit for providing the same bit value on both inputs of the single serializing lanes.

7. The digital to analog conversion circuit of claim 1, the digital to analog conversion circuit comprising a lane switching circuit, which activates either a non-serializing lane in an increased bit-depth mode or activates a serializing lane in an increased conversion rate mode.

8. The digital to analog conversion circuit of claim 7, the digital to analog conversion circuit comprising a bit switching circuit for providing the same bit value on both of the inputs of the single serializing lanes in the increased bit-depth mode and for providing two consecutive bit values on both of the inputs of the single serializing lanes in the increased conversion rate mode.

9. The digital to analog conversion circuit of claim 1, each one of the serializing lanes and each one of the non-serializing lanes comprising for every bit input a first latch, which is connected to the respective input, and a second latch, which is connected to the first latch.

10. The digital to analog conversion circuit of claim 9, the digital to analog conversion circuit comprising a clock input, which provides a clock signal, and a clock inverter, which is connected to the clock input and provides an inverted clock signal, wherein the first latches are clocked by the inverted clock signal and the second latches are clocked by the clock signal.

11. The digital to analog conversion circuit of claim 10, each serializing lane comprising for the second bit input a third latch, which is connected to the second latch and is clocked by the inverted clock signal, and a multiplexer, which is connected to the second latch of the first bit input and the third latch and is clocked by the inverted clock signal.

12. The digital to analog conversion circuit of claim 1, the digital to analog conversion circuit comprising digital to analog conversion, DAC, segments, wherein the serializing lanes and the non-serializing lanes form a first DAC segment for a predetermined number of least significant bits of the DAC and the further DAC segments convert the further bits of the total bit depth of the DAC.

13. The digital to analog conversion circuit of claim 12, one of the further DAC segments comprising a binary DAC.

14. A method for digital-to-analog conversion, the method comprising:
  outputting two bit inputs serially via a serialized output port at a predetermined first clock rate with each one of a number of serializing lanes, each serializing lane comprising at least two bit inputs,
  outputting two bit inputs in parallel each via a separate parallel output port of each one of a number of non-serializing lanes at a second clock rate, which is half the clock rate of the first clock rate, each non-serializing lane comprising at least two bit inputs, and
  producing an output current based on the serially output bits and the bits output in parallel with a current switching network, which comprises a bit input port for every one of the serialized output ports and for every one of the parallel output ports.

15. The method of claim 14, comprising generating a clock signal with a low phase noise clock buffer and distributing the clock signal with a clock tree with a predetermined load, wherein the low phase noise clock buffer is tuned to drive the clock tree with the predetermined load.

16. The method of claim 15, comprising producing the output current in each one of the serializing lanes with a switching device connected to the respective serialized output port, and producing the output current in each one of the non-serializing lanes with two switching devices, each switching device being connected to the respective parallel output port, each one of the switching devices being further connected to a respective output port of the clock tree and receiving the clock signal.

17. The method of claim 16, comprising providing in each case with the two switching devices being connected to the two bit output ports of one of the non-serializing lanes in sum the same load on the respective output ports of the clock tree as one switching device being connected to one of the bit output ports of one of the serializing lanes.

18. The method of claim 16, comprising producing the output current with an R-2R circuit connected to the switching devices based on the switching states of the switching devices.

19. The method of claim 14, comprising providing the same bit value on both inputs of the single serializing lanes.

20. The method of claim 14, comprising activating either a non-serializing lane in an increased bit-depth mode or activating a serializing lane in an increased conversion rate mode.

21. The method of claim 20, comprising providing the same bit value on both of the inputs of the single serializing lanes in the increased bit-depth mode and providing two consecutive bit values on both of the inputs of the single serializing lanes in the increased conversion rate mode.

22. The method of claim 14, comprising delaying in each one of the serializing lanes and each one of the non-serializing lanes every bit input via a first latch, which is connected to the respective input, and a second latch, which is connected to the first latch.

23. The method of claim 22, comprising providing a clock signal and an inverted clock signal, wherein the first latches are clocked by the inverted clock signal and the second latches are clocked by the clock signal.

24. The method of claim 23, comprising in each serializing lane further delaying the second bit input with a third latch, which is connected to the second latch and is clocked by the inverted clock signal, and multiplexing the signal of the second latch of the first bit input and the third latch.

* * * * *

UNITED STATES PATENT AND TRADEMARK OFFICE
CERTIFICATE OF CORRECTION

| | |
|---|---|
| PATENT NO. | : 9,712,182 B1 |
| APPLICATION NO. | : 15/293598 |
| DATED | : July 18, 2017 |
| INVENTOR(S) | : Huard |

It is certified that error appears in the above-identified patent and that said Letters Patent is hereby corrected as shown below:

In the Specification

Column 3, Line 20:
Replace "R-R2""
With --R-2R--

In the Claims

Column 9, Line 59 Claim 5:
Replace "R-R2"
With --R-2R--

Signed and Sealed this
Twenty-ninth Day of May, 2018

Andrei Iancu
*Director of the United States Patent and Trademark Office*